United States Patent
Ebihara

(10) Patent No.: US 10,205,087 B2
(45) Date of Patent: Feb. 12, 2019

(54) SEMICONDUCTOR DEVICE

(71) Applicant: SII Semiconductor Corporation, Chiba-shi, Chiba (JP)

(72) Inventor: Mika Ebihara, Chiba (JP)

(73) Assignee: ABLIC INC. (JP)

( * ) Notice: Subject to any disclaimer, the term of this patent is extended or adjusted under 35 U.S.C. 154(b) by 4 days.

(21) Appl. No.: 15/066,266

(22) Filed: Mar. 10, 2016

(65) Prior Publication Data

US 2016/0276577 A1 Sep. 22, 2016

(30) Foreign Application Priority Data

Mar. 17, 2015 (JP) ................................. 2015-053799

(51) Int. Cl.
*H01L 43/04* (2006.01)
*H01L 27/22* (2006.01)
*H01L 43/06* (2006.01)
*H01L 43/14* (2006.01)
*G01R 33/00* (2006.01)
*G01R 15/20* (2006.01)
*G01R 21/08* (2006.01)
(Continued)

(52) U.S. Cl.
CPC .............. *H01L 43/04* (2013.01); *G01R 15/20* (2013.01); *G01R 15/202* (2013.01); *G01R 21/08* (2013.01); *G01R 33/0011* (2013.01); *G01R 33/06* (2013.01); *G01R 33/07* (2013.01); *G01R 33/077* (2013.01); *H01L 27/22* (2013.01); *H01L 43/06* (2013.01); *H01L 43/065* (2013.01)

(58) Field of Classification Search
CPC .. G01R 33/0011; G01R 15/20; G01R 15/202; G01R 21/08; G01R 33/07; G01R 33/077; G01R 33/06; H01L 43/04; H01L 43/065; H01L 27/22; H01L 43/06; H01L 43/14
See application file for complete search history.

(56) References Cited

U.S. PATENT DOCUMENTS

| 4,692,703 A | * | 9/1987 | Extance | ................. G01R 33/04 324/117 H |
|---|---|---|---|---|
| 2002/0021124 A1 | | 2/2002 | Schott et al. | ............. 324/207.2 |

(Continued)

FOREIGN PATENT DOCUMENTS

| EP | 2006700 A2 * | 12/2008 | ......... G01R 33/0011 |
|---|---|---|---|
| JP | 2002071381 | 3/2002 | |
| JP | 2007263721 | 10/2007 | |

OTHER PUBLICATIONS

Abstract, Publication No. 2003-142752 Publication Date May 16, 2003.

(Continued)

*Primary Examiner* — Thanhha S Pham
(74) *Attorney, Agent, or Firm* — Adams & Wilks

(57) ABSTRACT

A semiconductor device has a magnetic sensor configured to detect a direction of magnetism. The magnetic sensor includes Hall elements arranged on a surface of a semiconductor substrate, and a magnetic flux concentrator formed of a magnetic material having the function of amplifying magnetism. The magnetic flux concentrator is arranged on the semiconductor substrate and at least partly covers each of the Hall elements. A slit or a slot is formed in the magnetic material to inhibit generation of stress applied to the Hall elements.

18 Claims, 7 Drawing Sheets

(51) Int. Cl.
*G01R 33/07* (2006.01)
*G01R 33/06* (2006.01)

(56) References Cited

U.S. PATENT DOCUMENTS

| | | | |
|---|---|---|---|
| 2011/0193556 A1 | 8/2011 | Paci et al. | 324/251 |
| 2011/0204887 A1* | 8/2011 | Ausserlechner | G01R 15/202 |
| | | | 324/251 |

OTHER PUBLICATIONS

Abstract, Publication No. 2007-263721, Publication Date Oct. 11, 2007.
Notification of Reasons for Refusal, dated Nov. 6, 2018 in Japanese Application No. 2015-053799 together with an English-language machine translation thereof.

\* cited by examiner

SEMICONDUCTOR DEVICE

BACKGROUND OF THE INVENTION

1. Field of the Invention

The present invention relates to a semiconductor device, and more particularly, to a semiconductor device including a sensor configured to detect a direction of magnetism.

2. Description of the Related Art

A magnetic sensor technology has hitherto been known well in which a magnetic material, a magnetic flux concentrator, having a function of amplifying magnetism and a Hall element are combined. For example, in Japanese Patent No. 4936299, there is disclosed a technology relating to a sensor configured to detect a direction of a magnetic field that can detect a vertical magnetic field and a horizontal magnetic field. The sensor includes a magnetic flux concentrator formed on a surface of a semiconductor chip and having a flat shape, and a plurality of Hall elements. These Hall elements are arranged in an end portion region of the magnetic flux concentrator. Such a structure has an effect that magnetism in the Hall element region can be amplified.

FIG. 5 is a schematic view for illustrating a related-art magnetic sensor (see Japanese Patent Application Laid-open No. 2003-142752). The magnetic sensor includes a semiconductor substrate 1, Hall elements 2a and 2b, a protective layer 3, an underlayer metal layer 4, and a magnetic flux concentrator 5. The conventional art relates to a method of manufacturing a magnetic sensor that includes a magnetic flux concentrator having the function of amplifying magnetism and is configured to detect a magnetic flux that leaks from an end portion of the magnetic flux concentrator using the Hall elements. The underlayer metal layer 4 is formed above the semiconductor substrate 1 via the protective layer 3, and further, the magnetic flux concentrator 5 at a thickness of 15 μm having the function of amplifying magnetism is arranged on the underlayer metal layer 4. Such a manufacturing method has effects that a small magnetic sensor including Hall elements and a magnetic flux concentrator formed of a soft magnetic material can be manufactured with ease, and that the magnetic flux concentrator can be close to the Hall elements to realize a highly sensitive magnetic sensor.

FIG. 6 is a process flow diagram for illustrating a method of manufacturing a magnetic flux concentrator of a related-art magnetic sensor, in which a process of bonding a magnetic tape onto the semiconductor substrate 11 is illustrated. First, a wafer having ICs formed thereon is prepared. Then, the magnetic tape (amorphous metal tape) is bonded onto the wafer using an epoxy adhesive. Next, a magnetic flux concentrator pattern 14 is formed by photolithography. Then, the amorphous metal is etched. In this way, the magnetic flux concentrator is formed on the semiconductor substrate 11. The magnetic flux concentrator in this case has a thickness of 20 μm or more.

As described above, in the magnetic sensor illustrated in FIG. 5, the magnetic flux concentrator has a thickness of 15 μm or more. In the magnetic sensor illustrated in FIG. 6, the magnetic flux concentrator arranged on the semiconductor substrate 11 is formed using the magnetic tape at a thickness of 20 μm or more. When such a magnetic tape is used, the magnetic tape is bonded onto the semiconductor substrate 11 using an epoxy adhesive 12, and thus, there is a problem in that strong stress is applied to the Hall elements therebelow.

FIGS. 7A and 7B illustrate a magnetic sensor provided for the purpose of solving such a problem (see Japanese Patent No. 5064706). The magnetic sensor includes a semiconductor substrate 21 having a plurality of Hall elements 22a, 22b arranged therein, and a single magnetic material 23 (magnetic flux concentrator) having the function of amplifying magnetism that is arranged on a surface of the semiconductor substrate and that at least partly covers each of the Hall elements, the Hall elements being located in the vicinity of end portions of the magnetic flux concentrator. In the magnetic sensor, the magnetic flux concentrator is formed by electrolytic plating at a thickness of 6.1 μm to 14 μm. There is an effect that strong stress is prevented from being applied to the Hall elements to inhibit generation of an offset voltage due to a piezoelectric effect.

However, the technology disclosed in Japanese Patent No. 5064706 (see FIGS. 7A-7B) has a problem in that a small thickness of a magnetic material (magnetic flux concentrator) lowers the function of amplifying magnetism. Further, even though the magnetic flux concentrator has a small thickness, the magnetic material partly or entirely covers Hall elements, and thus, stress is generated. Hence, there is a problem in that generation of an offset voltage and the like due to a piezoelectric effect cannot be sufficiently inhibited. Further, elements other than the Hall elements are arranged as well below the magnetic material, and thus, change in characteristics thereof due to the stress in a similar way is another problem.

SUMMARY OF THE INVENTION

The present invention has been made in view of these problems, and an object of the present invention is to provide a magnetic sensor including Hall elements and a magnetic flux concentrator that is a magnetic material having the function of amplifying magnetism in combination, in which stress is prevented from being applied to the Hall elements as much as possible irrespective of the thickness of the magnetic flux concentrator.

In order to solve the problems described above, according to one embodiment of the present invention, there is provided a magnetic sensor including Hall elements and a magnetic material (magnetic flux concentrator) having the function of amplifying magnetism in combination, the Hall elements being arranged on a surface of the semiconductor substrate and the magnetic material having the function of amplifying magnetism being arranged on the semiconductor substrate and at least partly covering the Hall elements, in which a slit or a slot is formed in the magnetic material so that stress is prevented from being applied to the Hall elements as much as possible irrespective of the thickness of the magnetic material.

The present invention has a feature in that the magnetic material is formed by electrolytic plating.

The magnetic material can be formed by processing foil of the magnetic material.

The present invention has another feature in that the slit or the slot in the magnetic material has a width of 1 μm to 50 μm.

According to the one embodiment of the present invention, the slit or the slot is formed in the magnetic material (magnetic flux concentrator), and thus, stress is prevented from being applied as much as possible not only to the Hall elements but also to all elements arranged below the magnetic material such as a transistor, a resistor, and a capacitor, and hence a semiconductor device capable of adjusting stress may be provided at a low cost with ease.

DETAILED DESCRIPTION OF THE INVENTION

Embodiments of the present invention are described below with reference to the attached drawings.

Figure 1A:
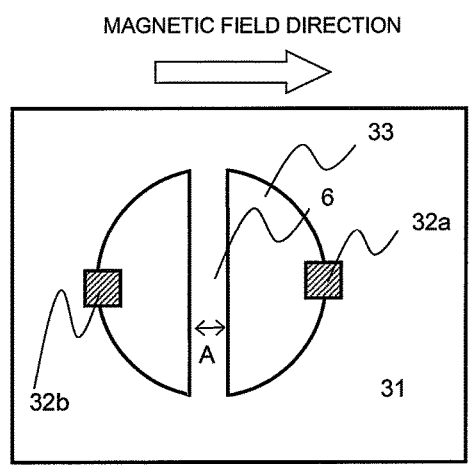
FIG. 1A to FIG. 1C are plan views for illustrating a semiconductor device according to one embodiment of the present invention.
Figure 1B:
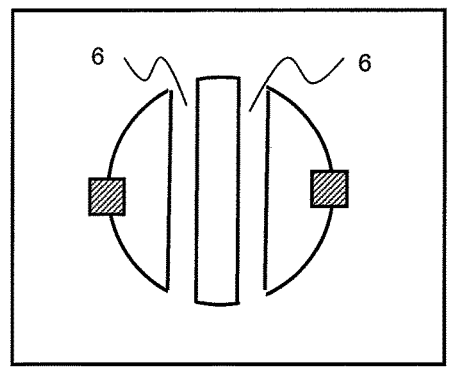
Figure 1C:
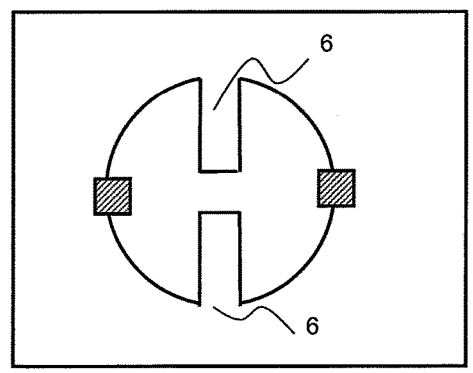

FIG. 1A, FIG. 1B, and FIG. 1C are plan views for illustrating a magnetic sensor serving as a semiconductor device according to one embodiment of the present invention. Hall elements 32a and 32b are spaced in a surface of a semiconductor substrate 31. A magnetic flux concentrator 33 is arranged above the Hall elements 32a and 32b via a protective film. The magnetic flux concentrator 33 is arranged so that an edge, namely, an outer periphery thereof may be positioned above the Hall elements 32a and 32b. The slit 6 is formed in the magnetic flux concentrator 33. A slit 6 as used herein means a groove that extends inward from the outer periphery (edge) of the magnetic flux concentrator 33. The groove pierces the magnetic concentrator 33 from a top surface of the magnetic flux concentrator 33 to a bottom surface thereof.

The magnetic flux concentrator 33 can be formed by electrolytic plating. The magnetic flux concentrator 33 can be formed by processing foil of the magnetic material as well.

The magnetic sensor according to the present invention includes the Hall elements 32a and 32b and the magnetic material (magnetic flux concentrator) 33 having the function of amplifying magnetism. The magnetic flux concentrator 33 is formed of a soft magnetic material, and it is desired that the magnetic flux concentrator 33 be a film having a higher magnetic permeability and a lower coercivity. Accordingly, it is preferred that a material of the magnetic flux concentrator 33 be Permalloy, Mu-metal, metal glass, or Supermalloy. Further, the magnetic flux concentrator 33 may be in the shape of a circle or a polygon. The magnetic flux concentrator 33 is arranged so as to at least partly cover regions of the plurality of Hall elements 32a and 32b. The edge of the magnetic flux concentrator 33 crosses the regions occupied by the plurality of Hall elements 32a and 32b. The Hall elements 32a and 32b are arranged so as to be spaced from each other approximately by a length of, when the magnetic flux concentrator is circular, a diameter of the circle, and, when the magnetic flux concentrator is polygonal, a length between opposite sides of the polygon.

In Japanese Patent No. 5064706 described above, an upper limit value of the thickness of the magnetic flux concentrator is 14 μm. However, as described above, a small thickness of the magnetic flux concentrator lowers the function of amplifying magnetism. In view of this, according to the present invention, a slit is formed in the magnetic flux concentrator 33 to alleviate stress. As illustrated in FIG. 1A, the slit 6 extends completely across the magnetic flux concentrator 33 and is formed in a direction perpendicular to a direction of magnetism to be applied to a center portion of the circular magnetic flux concentrator 33, and the magnetic flux concentrator 33 is thereby divided into two portions or parts. The slit 6 has a width A in a range of from 1 μm to 50 μm. A too large width of the slit 6 results in difference in sensitivity between the Hall element 32a and the Hall element 32b that are below the edge portion of the magnetic flux concentrator, and thus, the width is required to be 50 μm or less. However, the present invention is not limited to this structure, and, depending on characteristics of the Hall elements, the number of the slit 6 may be two as illustrated in FIG. 1B to divide the magnetic flux concentrator 33 into three portions. Further, the number of the slit 6 may be three or more. Still further, as illustrated in FIG. 1C, the center portion of the magnetic flux concentrator 33 may be left intact and the slit 6 may be formed above and below the center portion so as to extend inward partway from the outer edge of the magnetic flux concentrator 33. However, in all of these cases, the slit width is required to be 1 μm to 50 μm.

Figure 2A:
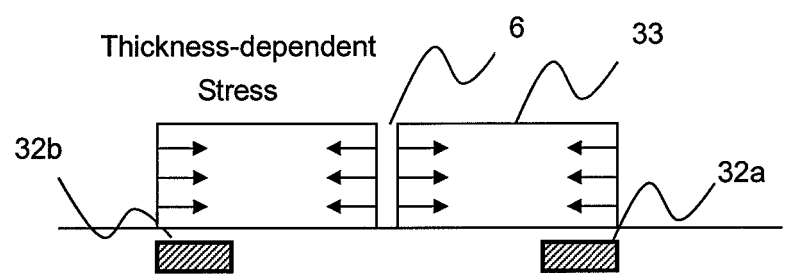
FIG. 2A and FIG. 2B are schematic sectional views for illustrating the semiconductor device according to the one embodiment of the present invention.
Figure 2B:
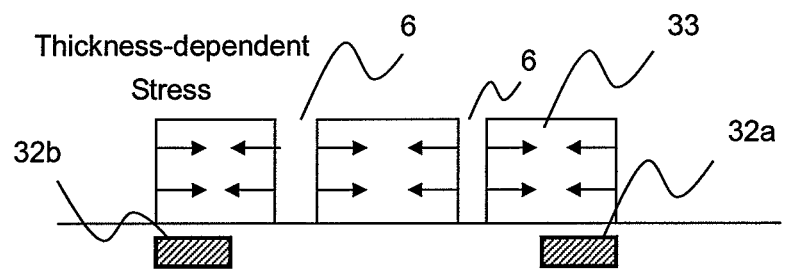
Figures 7A, 7B:
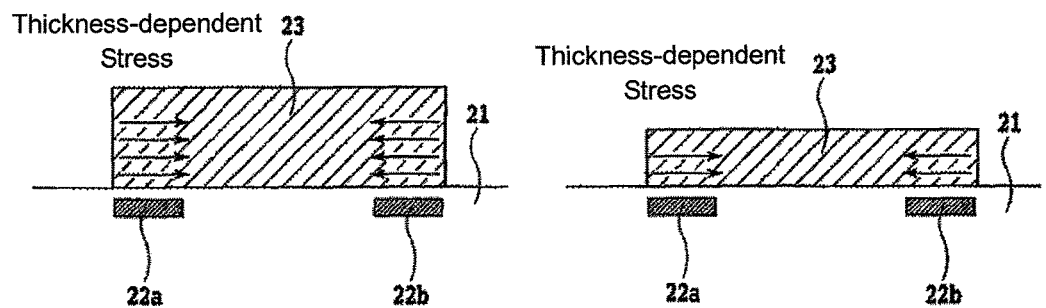
FIG. 7A and FIG. 7B are schematic sectional views for illustrating a related-art magnetic sensor.

In the related art illustrated in FIG. 7A and FIG. 7B, there is no slit in a magnetic flux concentrator 23, and thus, as the magnetic flux concentrator 23 becomes thicker, stress applied to Hall elements 22a and 22b arranged under the end portions of the magnetic flux concentrator 23 becomes stronger. As a result, the offset voltage increases due to the piezoelectric effect. On the other hand, formation of the slit as illustrated in FIG. 2A reduces the stress applied to the Hall element 32a and 32b, which reduces change in offset voltage to inhibit lowering of the accuracy of detection. When the number of the slit is two as illustrated in FIG. 2B, the stress applied to the Hall elements 32a and 32b can be further reduced to further inhibit lowering of the accuracy of detection.

Figure 3A:
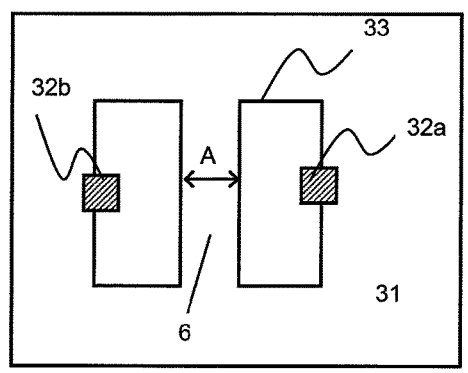
FIG. 3A to FIG. 3C are plan views for illustrating a semiconductor device according to one embodiment of the present invention.
Figure 3B:
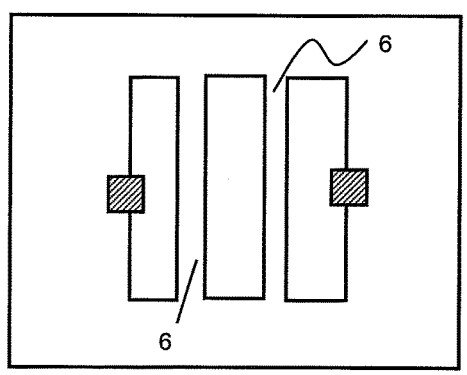
Figure 3C:
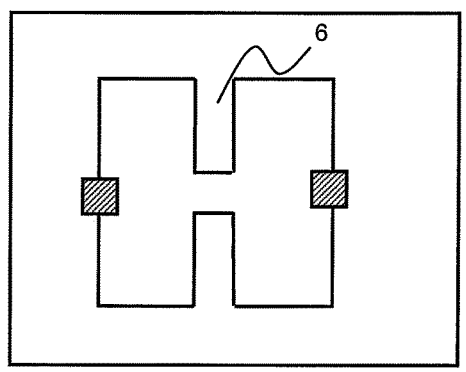

FIG. 3A, FIG. 3B, and FIG. 3C are plan views for illustrating a semiconductor device including a magnetic flux concentrator 33 in the shape of a quadrangle or a rectangle according to one embodiment of the present invention. The number of the slit 6 may be one as illustrated in FIG. 3A, or may be two as illustrated in FIG. 3B. In both the cases, the slit(s) 6 is/are formed in a direction perpendicular to a direction of a magnetic field to be applied. The number of the slit 6 may be three or more. Further, as illustrated in FIG. 3C, the center portion of the magnetic flux concentrator 33 may be left and the slits 6 may be formed above and below the center portion.

Figure 4A:
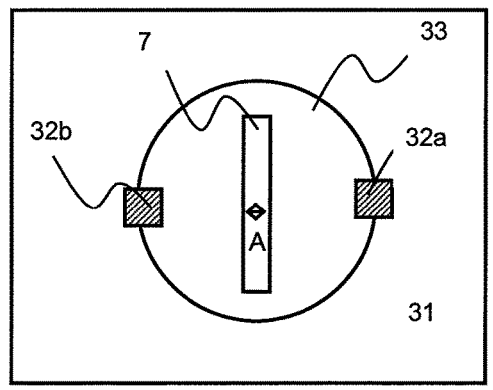
FIG. 4A to FIG. 4D are plan views for illustrating a semiconductor device according to one embodiment of the present invention.
Figure 4B:
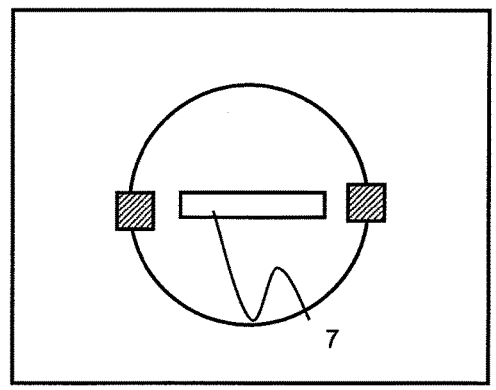
Figure 4C:
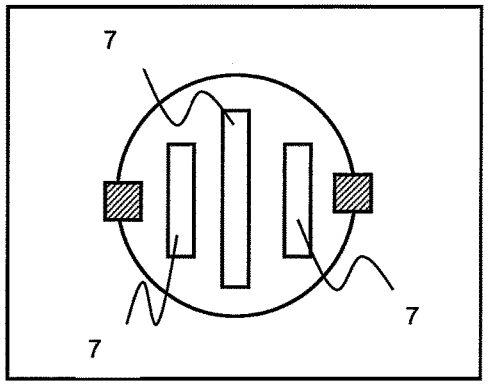
Figure 4D:
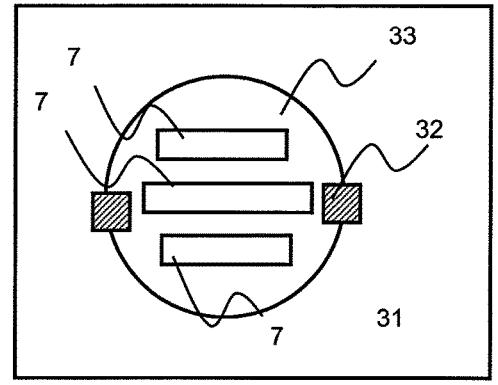
Figure 5:
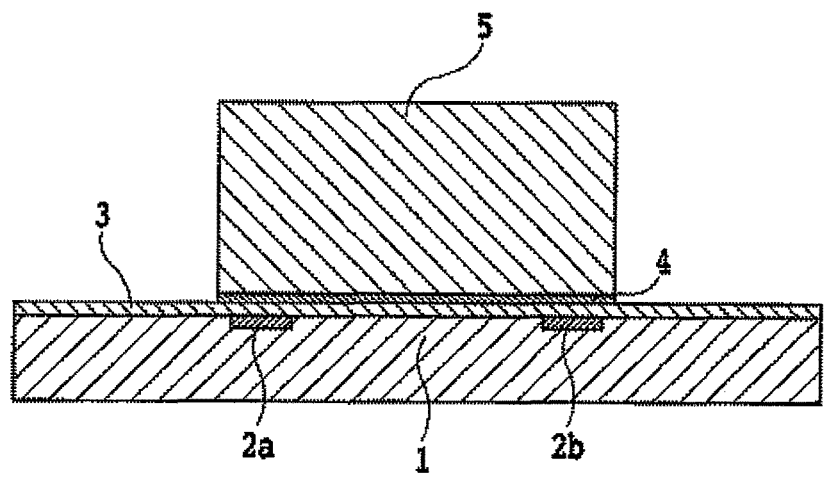
FIG. 5 is a schematic sectional view for illustrating a related-art magnetic sensor.
Figure 6:
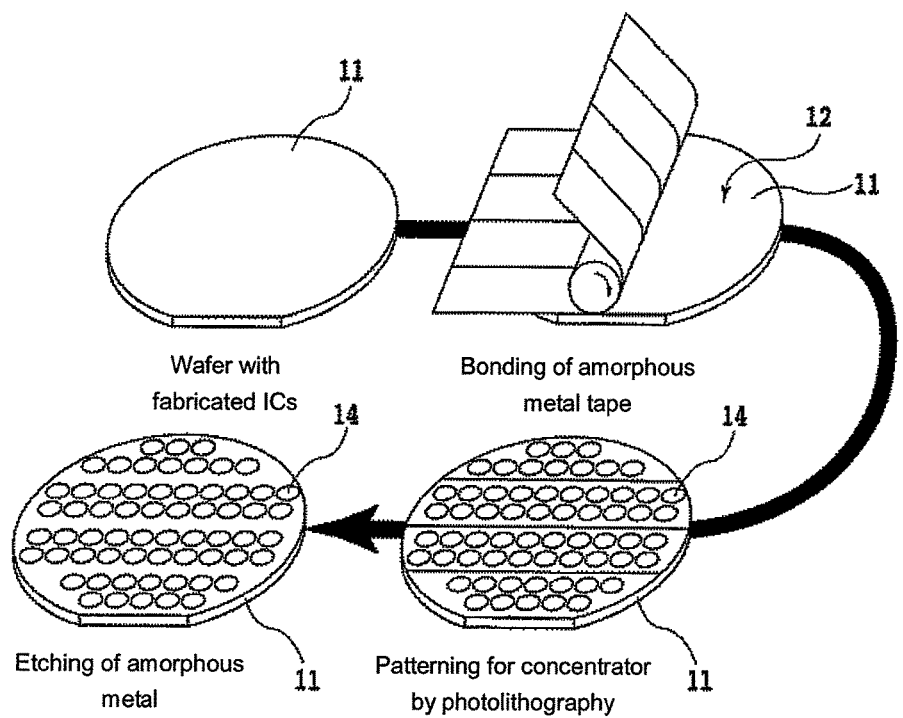
FIG. 6 is a process flow diagram for illustrating a method of manufacturing a magnetic flux concentrator of the related-art magnetic sensor.

FIG. 4A to FIG. 4D are plan views for illustrating a semiconductor device including a circular magnetic flux concentrator 33 according to one embodiment of the present invention. According to this embodiment, as illustrated in FIG. 4A, a slot 7 is formed in the center portion of the circular magnetic flux concentrator 33, thereby being capable of alleviating the stress. The slot 7 is a so-called opening, and does not overlap the outer periphery of the magnetic flux concentrator 33. Thus, the magnetic flux concentrator 33 is not entirely divided into two or more portions by the slot 7. It is required that the width A of the slot 7 to be set be 1 μm to 50 μm. The slot 7 is not necessarily required to be formed in a direction perpendicular to a direction of a magnetic field to be applied, and may be formed, as illustrated in FIG. 4C, in a direction in parallel therewith. Further, the number of the slot 7 is not limited to one, and, depending on the stress, may be two or more as illustrated in FIG. 4B and FIG. 4D. Further, the shape of the magnetic flux concentrator 33 is not limited to a circle, and may be a polygon such as a quadrangle or a rectangle.

As described above, by forming at least one of a slit and a slot in the magnetic flux concentrator, even if the thickness of the magnetic flux concentrator is not set to be as small as 14 µm or less, the stress can be alleviated, and generation of an offset voltage due to the stress can be inhibited.

What is claimed is:

1. A semiconductor device having a magnetic sensor, the magnetic sensor comprising:
   Hall elements arranged on a surface of a semiconductor substrate; and
   a magnetic flux concentrator disposed over the semiconductor substrate and at least partly covering each of the Hall elements, the magnetic flux concentrator having no terminals for electrically connecting the magnetic flux concentrator to another element and having at least one through-opening in the shape of an elongated slot that extends partway across the magnetic flux concentrator and that does not completely divide the magnetic flux concentrator into separate parts, the slot having a width of 1 µm to 50 µm and being configured to reduce stress applied to the Hall elements.

2. A semiconductor device according to claim 1, wherein the slot extends inwardly to the center portion from the outer edge of opposite sides of the magnetic flux concentrator.

3. A semiconductor device according to claim 1, wherein the at least one through-opening comprises a plurality of through-openings each in the shape of a slot.

4. A semiconductor device according to claim 3, wherein the slots do not extend to a center portion of the magnetic flux concentrator.

5. A semiconductor device according to claim 4, wherein the slots have a linear shape.

6. A semiconductor device according to claim 1, wherein the magnetic flux concentrator is made of a soft magnetic material.

7. A semiconductor device according to claim 6, wherein the soft magnetic material is permalloy, mu-metal, metal glass or supermalloy.

8. A semiconductor device having a magnetic sensor, the magnetic sensor comprising:
   Hall elements arranged on a surface of a semiconductor substrate; and
   a magnetic flux concentrator disposed over the semiconductor substrate and at least partly covering each of the Hall elements, the magnetic flux concentrator having no terminals for electrically connecting the magnetic flux concentrator to another element and having at least one through-opening in the shape of a slot that extends inwardly from an outer edge of the magnetic flux concentrator at least partway across the magnetic flux concentrator, the slot having a width of 1 µm to 50 µm and being configured to reduce stress applied to the Hall elements.

9. A semiconductor device according to claim 8, wherein the slot extends inwardly from the outer edge to a center portion of the magnetic flux concentrator.

10. A semiconductor device according to claim 9, wherein the slot extends inwardly to the center portion from the outer edge of opposite sides of the magnetic flux concentrator.

11. A semiconductor device according to claim 8, wherein the slot extends inwardly from the outer edge at opposite sides of the magnetic flux concentrator.

12. A semiconductor device according to claim 8, wherein the magnetic flux concentrator has a circular shape.

13. A semiconductor device according to claim 8, wherein the magnetic flux concentrator has a quadrangular shape.

14. A semiconductor device according to claim 8, wherein the slot has a linear shape.

15. A semiconductor device according to claim 8, wherein the magnetic flux concentrator is made of a soft magnetic material.

16. A semiconductor device according to claim 15, wherein the soft magnetic material is permalloy, mu-metal, metal glass or supermalloy.

17. A semiconductor device having a magnetic sensor, the magnetic sensor comprising:
   Hall elements arranged on a surface of a semiconductor substrate; and
   a magnetic flux concentrator disposed over the semiconductor substrate and at least partly covering each of the Hall elements, the magnetic flux concentrator having at least one through-opening in the shape of a slot that has a width of 1 µm to 50 µm and extends inwardly from an outer edge of the magnetic flux concentrator at least partway across the magnetic flux concentrator, and the magnetic flux concentrator being made of a soft magnetic material and not being electrically connected to any other element so that no current flows through the magnetic flux concentrator during use of the semiconductor device.

18. A semiconductor device according to claim 17, wherein the slot extends inwardly to the center portion from the outer edge of opposite sides of the magnetic flux concentrator.

* * * * *